(12) United States Patent
Graumann

(10) Patent No.: US 7,139,312 B2
(45) Date of Patent: Nov. 21, 2006

(54) SYSTEM AND METHOD FOR IMPROVING CODING GAIN PERFORMANCE WITHIN GIGABIT PHY VITERBI DECODER

(75) Inventor: Peter J. Graumann, Calgary (CA)

(73) Assignee: STMicroelectronics, Inc., Carrollton, TX (US)

( * ) Notice: Subject to any disclaimer, the term of this patent is extended or adjusted under 35 U.S.C. 154(b) by 940 days.

(21) Appl. No.: 10/156,292

(22) Filed: May 23, 2002

(65) Prior Publication Data
US 2003/0219083 A1 Nov. 27, 2003

(51) Int. Cl.
*H03H 7/30* (2006.01)

(52) U.S. Cl. .................... 375/233; 375/262; 375/265; 375/341; 714/792; 714/794; 714/795; 714/796

(58) Field of Classification Search ............. 375/229, 375/232, 233, 262, 265, 341, 348, 350; 714/786, 714/792, 794, 795, 796, 797
See application file for complete search history.

(56) References Cited

U.S. PATENT DOCUMENTS

| | | | |
|---|---|---|---|
| 5,870,433 A | 2/1999 | Huber et al. | 375/233 |
| 6,108,386 A * | 8/2000 | Chen et al. | 375/341 |
| 6,115,436 A | 9/2000 | Ramesh et al. | 375/341 |
| 6,201,831 B1 | 3/2001 | Agazzi et al. | 375/229 |
| 6,253,345 B1 | 6/2001 | Agazzi et al. | 714/752 |
| 6,378,106 B1 * | 4/2002 | Allpress et al. | 714/795 |
| 2002/0021772 A1 | 2/2002 | Shich | 375/341 |
| 2002/0056744 A1 | 5/2002 | Uchida et al. | 235/375 |

OTHER PUBLICATIONS

Hatamian, M., et al., "Design Considerations for Gigabit Ethernet 1000Base-T Twisted Pair Transceivers", *IEEE 1998 Custom Integrated Circuits Conference*.

Duel-Hallen, A., Heegard, C., "Delayed Decision Feedback Sequence Estimation", *IEEE Transactions on Communications*, vol. 37, No. 5, May 1989.

Haratsch, E., Azadet, K., "A 1-Gb/s Joint Equalizer and Trellis Decoder for 1000Base-T Gigabit Ethernet", IEEE Journal of Solid State Circuits, vol. 36, Nov. 3, Mar. 2001.

Haratsch, E. F., Blanksby, A. J. and Azadet, K., "Reduced-State Sequence Estimation with Tap-Selectable Decision-Feedback", *2000 IEEE*, pp. 372-376.

Haratsch, E. F., "High Speed VLSI Implementation of Reduced Complexity Sequence Estimation Algorithms with Application to Gigabit Ethernet 1000Base-T", *International Symposium on VLSI Technology Systems and Applications*, Taipei, pp. 171-174, Jun. 1999.

Haratsch, E. F. and Azadet, K. "High-Speed Reduced-State Sequence Estimation", *IEEE International Symposium on Circuits and Systems*, pp. 387-390, May 28-31, 2000, Geneva Switzerland,.

(Continued)

*Primary Examiner*—Dac V. Ha
(74) *Attorney, Agent, or Firm*—Lisa K. Jorgenson; Andre M. Szuwalski

(57) ABSTRACT

A method for improving gain performance of a Viterbi decoder wherein data relating to the best path and a secondary path are stored for the Viterbi decoder. Slicer errors are determined for the best path and the secondary path for current symbols using the stored data and errors for previous symbols are corrected responsive to the determined slicer errors.

25 Claims, 4 Drawing Sheets

OTHER PUBLICATIONS

Haratsch, E. F. and Azadet, K., "A Low Complexity Joint Equalizer and Decoder for 1000Base-T Gigabit Ethernet", *IEEE 2000 Custom Integrated Circuits Conference*.

Haratsch, et al., "A Low Complexity Joint Equalizer and Decoder for 1000Base-T Gigabit Ethernet", *IEEE 2000 Custom Integrated Circuits Conference*, pps. 465-468; XP002230023, dated May 2000.

Haratsch, et al., "A 1-Gb/s Joint Equalizer and Trellis Decoder for 1000Base-T Gigabit Ethernet", *IEEE Journal of Solid-State Circuits*, vol. 36, No. 3, dated Mar. 2001, XP002230024.

Hatamian, et al., "Design Considerations for Gigabit Ethernet 1000Base-T Pair Transceivers", *ieee 1998 Custom Integrated Circuits Conference*, pps. 335-342, dated May 1998.

European Search Report, EP 03253195, dated Jul. 9, 2003.

* cited by examiner

SYSTEM AND METHOD FOR IMPROVING CODING GAIN PERFORMANCE WITHIN GIGABIT PHY VITERBI DECODER

BACKGROUND OF THE INVENTION

1. Technical Field of the Invention

The present invention relates to DFSE decoders, and more particularly, to the improvement of coding gain performance in Gigibit Phy Viterbi Decoders.

2. Description of the Related Art

Gibabit Ethernet over copper medium is a rapidly evolving technology enabling one gigabit per second full duplex communication over existing category 5 twisted pair cable plants. 1 Gb/s communication throughput is achieved with four pairs of twisted pair cables and eight transceivers 40 (four at each end) operating at 250 Mb/s as depicted in FIG. 1. Modulation between the transmitting and receiving ends use baseband 5-level pulse amplitude modulation (PAM5) combined with trellis coding and partial response shaping as the basis for the transmission scheme. Eight bits of data are encoded to nine bits and these nine bits are encoded to four PAM5 signals. The information for any particular bit becomes spread over all channels.

FIG. 2 illustrates a block diagram of a 100 Base-T transceiver 45 used within the system in FIG. 1. The Gigabit Medium Independent Interface (GMII) 50 receives data in a byte-wide format at a rate of 125 MHz and passes the data on to a Physical Coding Sublayer (PCS) 55 which performs scrambling, coding and a variety of control functions. Except for the GMII 50 and PCS 55 blocks, FIG. 2 illustrates only one out of the four channels of the transceiver 45. The other three channels of the transceiver 45 have a similar block diagram. Within the PCS 55, eight bits of data are encoded to nine bits and these nine bits are encoded to four PAM5 signals. The corresponding symbol for each channel goes through a $0.75+0.25\ z^{-1}$ shaping at pulse shaper 60 followed by conversion at a 125 MHz D/A converter 65. Low-pass filtering and line driver/hybrid circuitry 70 further process the signal before transmission on the twisted pair wire.

On the receiver path, a received analog signal is preconditioned by the hybrid circuitry 70, and next goes through a 125 MHz A/D converter 75 sampled by a clock signal provided by the decision-directed timing recovery circuit 80. The output of the A/D converter 75 is filtered by a Feed Forward Equalizer (FFE) 85 which is an LMS-type adaptive filter performing channel equalization and precursor Inter Symbol Interference (ISI) cancellation. The symbols sent by the other three local transmitters cause impairments in the received signal for each channel through a near end crosstalk mechanism between the pairs. Since each receiver has access to data from the other three transmitters that cause the interference, it is possible to nearly cancel the effects of the interference. Cancellation is accomplished with three adaptive NEXT canceling filters 90. The output of the NEXT canceling filters 90 are added to the FFE 85 output to cancel the interference. Similarly, because of the bidirectional nature of the channel, an echo impairment is caused by each transmitter on its own receiver signal. This impairment is also nearly canceled using an echo canceled 95, another adaptive filter, whose output is also directly added to the FFE 85 output.

The outputs of the FFE 85, echo canceled 95 and the three NEXT chancellors 90 are combined with the output of the adaptive feedback filter and input to the Decision Feedback Sequence Estimation (DFSE) Viterbi decoder 100 as partially equalized channel values to generate a soft decision. Inside the DFSE equalization is completed on each of four channels resulting in soft decisions which are further processed by the decoder to obtain the most likely eight bit value for the current sample. The operation of the DFSE Viterbi decoder 100 and the algorithm executed thereby more fully described in "*Design Considerations for Gigabit Ethernet* 100 *Base-T Twisted Pair Transceivers*", Hatamian et al. IEEE 1998 Custom Integrated Circuits Conference, pp. 335-342 and "*A* 1-*Gb/s Joint Equalizer and Trellis Decoder for* 100 *Base-T Gigabit Ethernet*", Haratsch and Azadet, IEEE Journal of Solid State Circuits, Vol. 36, No. 3, March 2001, pp. 374-384 which are incorporated herein by reference. The DFSE Viterbi decoder 100 is also referred to as a 8 state Decision Feedback Equalizer (DFE) Viterbi decoder.

In practice, DFSE decoder 100 suffers from an error propagation effect. Error propagation describes the process of incorrect decisions within a Viterbi traceback memory being propagated through DFE filters and causing increased noise and errors at the input of the Viterbi decoder 100. As a result, the coding gain of such a system is in practice less than five decibels for a particular 100 meter channel and degrades further as the channel lengthens and the magnitude of the DFE coefficient increases. Another challenge within 8-DFE Viterbi decoders is the critical path of the circuitry required for a hardware implementation limits the addition of new hardware to improve gain performance. Thus, there is a need to increase coding gain performance and provide performance and immunity against large coefficient values within DFE filters while not adding additional circuitry within the already tightly constrained critical path of a DFSE Decoder.

SUMMARY OF THE INVENTION

The present invention overcomes the foregoing and other problems with a system and method for improving gain performance of a DFSE Viterbi decoder. A system and method improves gain performance of a Viterbi decoder wherein data relating to the best path and a secondary path are stored for the Viterbi decoder. Slicer errors are determined for the best path and the secondary path for current symbols using the stored data and errors for previous symbols are corrected responsive to the determined slicer errors.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION

Figure 3:
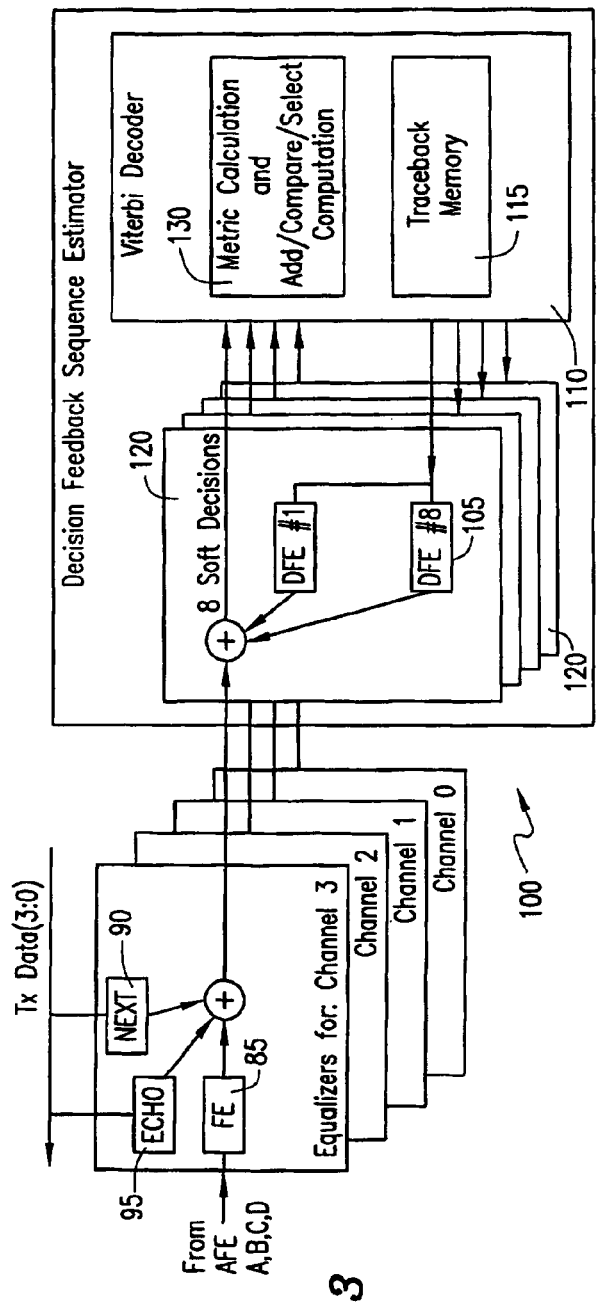
FIG. 3 is a block diagram of an 8 state decision feedback sequence estimation (DFSE) decoder within a 1000 Base-T transceiver.

Referring now to the drawings, and more particular to FIG. 3, there is illustrated a functional block diagram of a Decision Feedback Equalizer Viterbi Decoder 100. The Gigibit Phy Base 1000-T specification, "*Physical Layer Parameters and Specification for* 1000 *MB/s Operation over* 4*-pair of Category* 5 *Balanced Copper Cabling, Type* 1000 *Base-T*", IEEE standard 802.3ab, 1999, which is incorporated herein by reference, requires the use of a sophisticated sequence estimation and equalization technique called decision feedback sequence estimation (DFSE) to obtain up to 6 dB of coding gain within uncoded PAM-5 signaling. DFSE combines Viterbi decoding (sequence estimation) with equalization using decision feedback equalizer (DFE) filters 105. The Viterbi decoder 110 includes eight states and each of these states maintain a traceback memory 115 containing the optimal data values leading up to a particular state. The traceback memory values are used as data values for the DFE filters 105 that cancel the inter symbol interference (ISI) introduced by the Gigabit channel. During error free operation, one of the eight states represents the true state of the transmitter and contains correct data in its traceback memory 115 and by virtue of this has correct ISI cancellation on subsequently received symbols. The other seven states have one or more erroneous symbols in their traceback memories 115 and have incorrect ISI cancellation.

Figure 1:
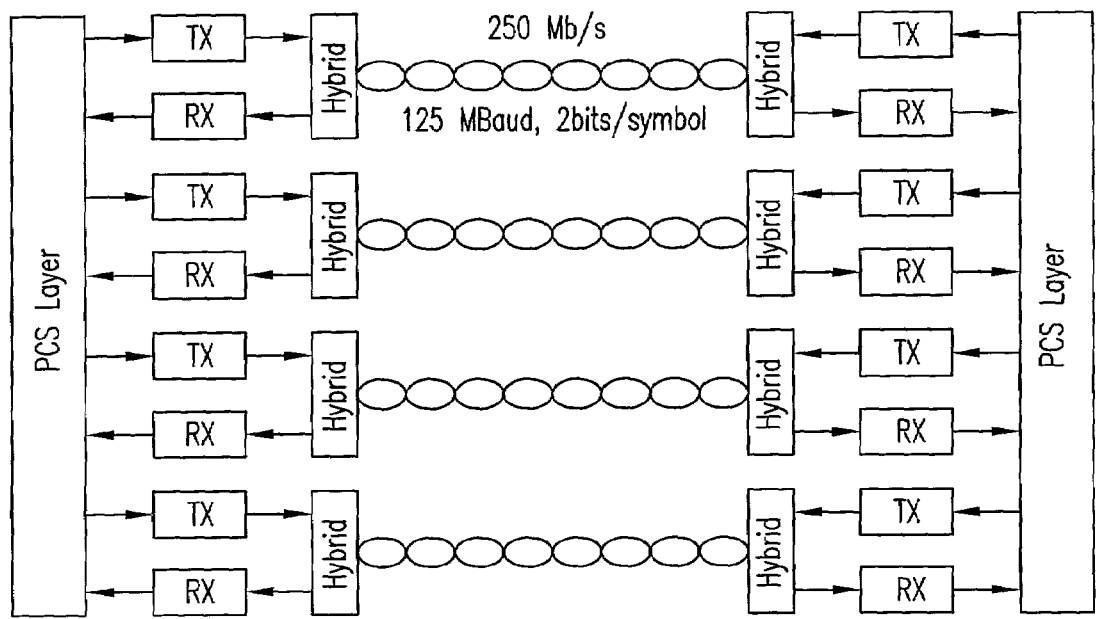
FIG. 1 is an illustration of a Gigabit Ethernet.
Figure 2:
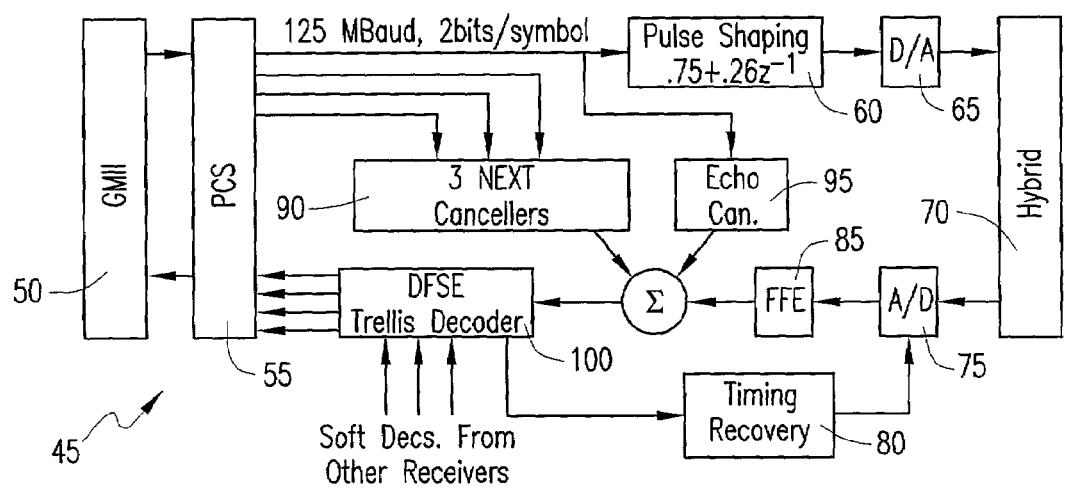
FIG. 2 is a block diagram of a 1000 Base-T transceiver.

In the most complete realization of the Gigabit Phy DFSE 100, eight DFE filters 105 are required for each of four channels 120. Each channel 120 receives input from a feed forward equalizer 125 for the channel, consisting of the sum outputs of the filter estimator 85, echo canceled 95 and NEXT chancellors 90 described previously with respect to FIG. 2. For each channel 120, the input from the equalizer 85 is summed with the outputs of each of decision feedback equalizer filters 105 to provide the eight soft decisions, one of which includes the true state of the transmitter as described above. The Viterbi decoder 110 receives the 32 soft decisions from each received symbol 120. Each of the 8 states in the decoder leads to 4 possible transitions for a total of 32 different transitions. The Add/Compare/Select (ACS) operations select 8 "winners" from these 32 to be used in the next iteration of the decoder. The Viterbi Decoder 110 includes ACS operators 130 to select the most promising path for each of the 8 states in the decoder and a traceback memory 15 to store the survivor paths leading up to each of these 8 states. The Viterbi Decoder 110 also maintains a metric for each of the 8 states representing the quality of each of the 8 states.

In order to improve the coding gain characteristics of the transceiver, a process of decision enhancement is implemented within the Viterbi decoder 110 using the slicer errors of current symbols to enhance the decisions made on previous symbols. The decision enhancement method of the present invention is more fully illustrated with respect to FIG. 4. The decision enhancement process maintains at step 140 two traceback memories for each of the eight Viterbi decoder states. The first traceback memory comprises the "best traceback memory" and stores the best survivor path through the decoder trellis leading up to this state. The "secondary traceback memory" stores the most promising alternate or secondary path through the decoder trellis leading up to this state. The best traceback memory element is full length (i.e., same as DFE filter length) while the secondary traceback memory element has a length of S elements, where S can be two symbols up to the full length of the best traceback memory.

For each state in the Viterbi decoder 110 a differential metric representing the relative quality of the best path versus the secondary path is initialized at step 145. The differential metric is computed by subtracting the "secondary metric" from the "best metric" with the metrics being taken directly from the computed state metrics within the Viterbi decoder 110. For subsequent symbols, slicer errors for the best path and the secondary path are computed at step 148 by summing the slicer error from each of the four channels together for both of the paths. The best path slicer error is subtracted from the secondary path slicer error at step 149 (to improve performance the result may be scaled by a constant). The result is added to the existing differential metric at step 150 to create a new differential metric.

Inquiry step 155 determines if the new differential metric is negative. If so, the secondary path is designated as the best path for the current state at step 160, the best path is designated as the secondary path for the current state at step 165, and the differential metric is multiplied by −1.0 at step 175. This operation performs a correction on the traceback memory 115 of the Viterbi Decoder 110 based upon obtaining the lowest possible slicer error for subsequently received data symbols and minimizing overall errors.

For each cycle of the decoder 110, a new secondary path is available from the Viterbi Decoder. Inquiry step 180 determines if the new differential metric of the existing best path and the new secondary path is smaller or larger than the current differential metric for the existing best path and existing secondary path or if a counter measuring the depth of the secondary metric is less than a max value S. If smaller or the counter equals S, the new secondary path is selected from the Viterbi Decoder at step 185 the counter is reset to 0 at step 180 and further slicer error calculations are made based on the newly selected secondary path by returning to step 148. If the new differential metric is larger than the current differential metric and the counter is less than S, the current secondary path is maintained at step 190, the counter is incremented at step 187 and future slicer error information can be processed on this pair of paths by returning to step 148.

Once a secondary path is selected from the Viterbi Decoder logic a counter is initialized at step 186. Each time the new paths from the decoder are rejected (step 180), the counter is incremented at step 187. When this counter reaches the depth of the secondary memory at step 180, the new secondary path from the decoder es selected at step 185 (180 is taken as always smaller). This secondary path is only valid to consider for S cycles of the algorithm, where S is the depth of the Secondary Traceback Memory. (Note after this time the data in the best and secondary paths for these S elements will be the same.)

Figure 4:
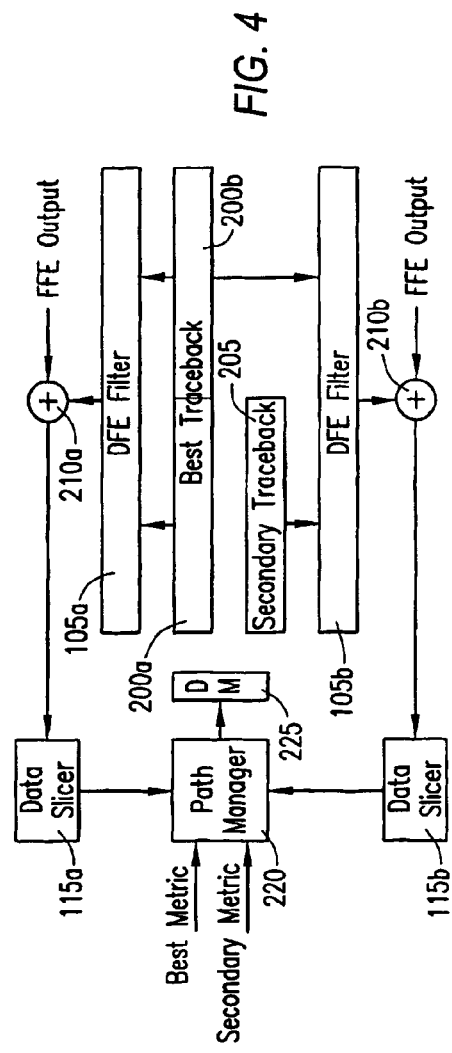
FIG. 4 is a flow diagram illustrating the technique for improving coding gain performance according to the present invention.
Figure 5:
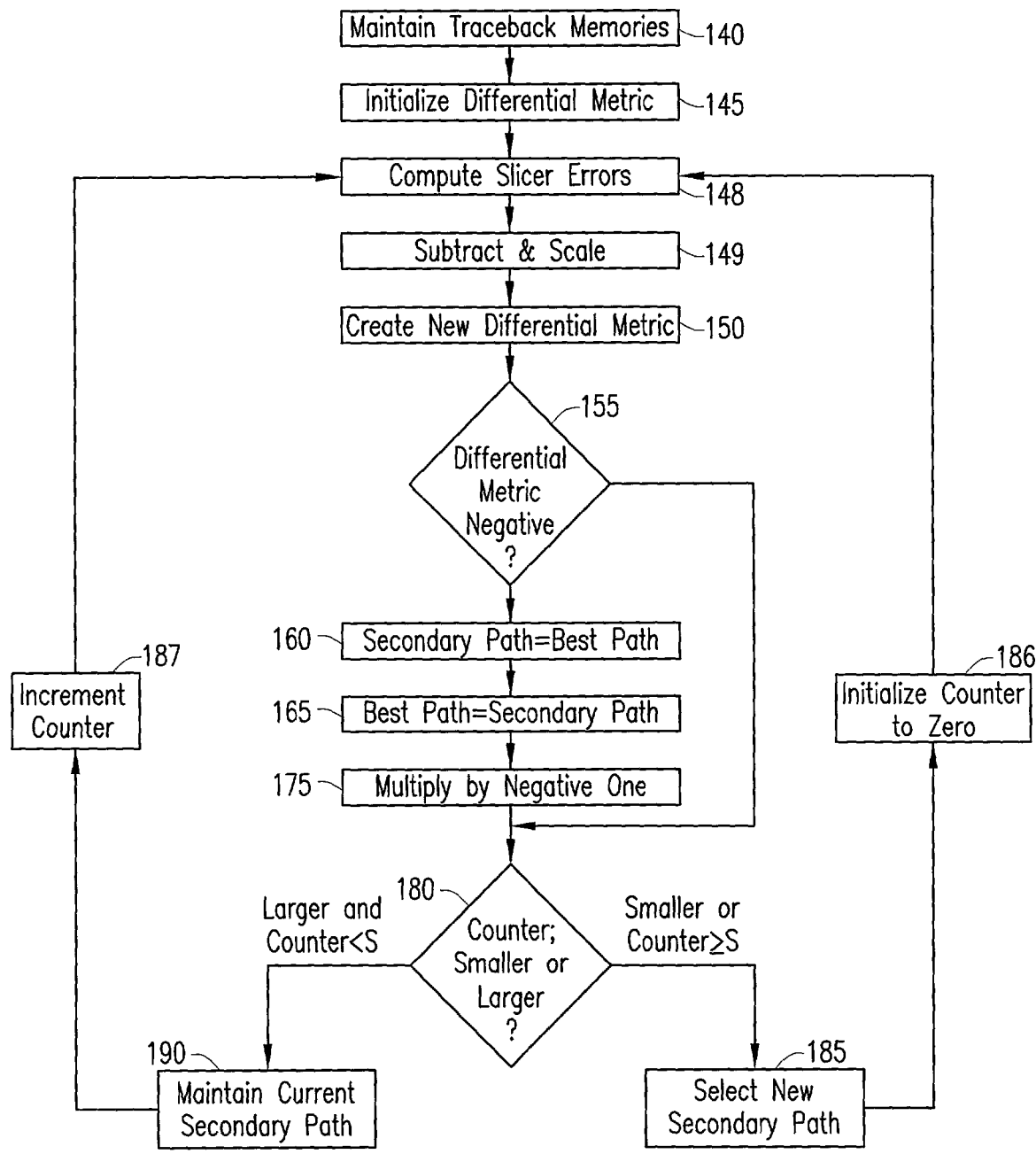
FIG. 5 is a block diagram illustrating the decision enhancement process of the present invention.

Referring now to FIG. 5, there is illustrated a functional block diagram of the decision enhancement process described with respect to FIG. 4. The best traceback memory 200 covers the full length of the DFE filter 105a. The secondary traceback memory 205 covers a smaller portion of the length of the DFE filter 105b. A DFE filter output is generated for the best path from a combination of the best traceback memory 200 contents and the DFE filter 105a. A DFE filter output is also generated for a secondary path from a combination of the secondary traceback memory 205 contents and a portion 200b of the best traceback memory 200 contents and the DFE filter 105b.

The outputs from the DFE filter 105a on the primary path and the DFE filter 105b on the secondary path are added together at adder 210 with the FFE output signal to generate the soft decisions. The adder output for each path is fed to a data slicer 115. The data slicer 115 computes the slicer error for the best path and the secondary path as described previously in step 148 of FIG. 4. The slicer error for each path in conjunction with the best metric and secondary metric information from the Viterbi Decoder logic is provided to a path manager module 220. The path manager module 220 updates differential metric 225 and steers the traceback memories as described in steps 155–190 of FIG. 4.

Figure 6:
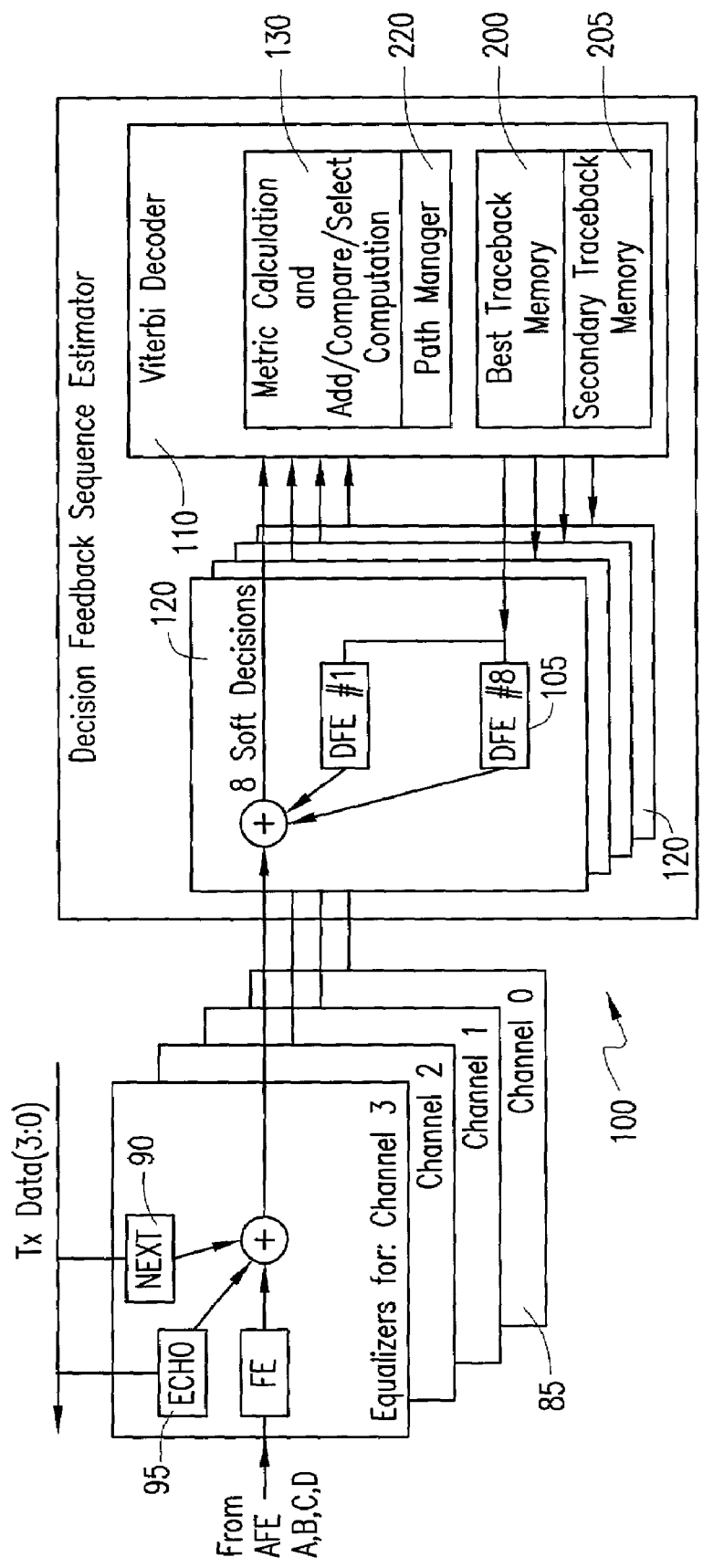
FIG. 6 illustrates an 8 state decision feedback sequence estimation decoder including the decision enhancement process of the present invention.

Referring now to FIG. 6, there is illustrated a block diagram of a decision feedback estimator 100 including the decision enhancement process of the present invention. As can be seen from the figure, the only difference between the decision sequence feedback estimator 100 of FIG. 6 and that of FIG. 3 are that the traceback memory 115 includes a best traceback memory 200 and a second traceback memory 205 and the metric calculation and add/compare/select computation logic further include the path manager module logic 220 described above.

Decision enhancement provides a coding gain improvement of up to 0.5 dB over traditional DFSE techniques and provides more robust operation over the range of possible coefficients in a DFE filter. In particular, the coding gain improvement provided by decision enhancement increases relative to the 8-DFE Viterbi Decoder architecture as the channel lengthens and the ISI increases or if the DFE coefficients become larger for any reason.

The previous description is of a preferred embodiment for implementing the invention, and the scope of the invention should not necessarily be limited by this description. The scope of the present invention is instead defined by the following claims.

What is claimed is:

1. A method for improving coding gain performance of a Viterbi decoder, comprising the steps of:
   storing optimal data values for a best path of a plurality of states for the Viterbi decoder;
   storing next optimal data values for a secondary path of the plurality of states for the Viterbi decoder;
   initializing a differential metric value for each of the plurality of states, the differential metric value representing a relative quality of the best path vs. the secondary path;
   computing a slicer error for both the best path and the secondary path for each of the plurality of states;
   computing a new differential metric responsive to the slicer error for the best path and the secondary path for each of the plurality of states; and
   determining the best path and the secondary path responsive to the new differential metric for each of the plurality of states.

2. The method of claim 1, wherein the step of initializing further comprises the steps of:
   computing a best metric of the Viterbi decoder;
   computing a secondary metric of the Viterbi decoder; and
   comparing the best metric and secondary metric to determine the differential metric.

3. The method of claim 1, wherein the step of computing a slicer error further comprises the step of summing slicer errors for each channel associated with the best path and the secondary path.

4. The method of claim 1, wherein the step of computing a new differential metric further comprises the steps of:
   subtracting the slicer error of the best path from the slicer error of the secondary path to obtain a slicer error result; and
   adding the scaled slicer error result to the differential metric to obtain the new differential metric.

5. The method of claim 1, wherein the step of determining the best path and the secondary path further comprises the step of correcting errors within the best traceback memory and the secondary traceback memory of the Viterbi decoder to obtain a lowest possible slicer error for subsequent data symbols.

6. The method of claim 5, wherein the step of correcting further comprises the steps of:
   determining if the new differential metric becomes negative;
   if the new differential metric becomes negative, establishing the secondary path as the best path and the best path as the secondary path for the current state; and
   multiplying the new differential metric by −1.0.

7. The method of claim 1, wherein the step of determining the best path and the secondary path further comprises the steps of:
   determining if the new differential metric is larger or smaller than the differential metric;
   if the new differential metric is smaller, selecting a new secondary path; and
   if the new differential metric is larger, maintaining a current secondary path.

8. A method, comprising the steps of:
   storing data relating to a best path and a secondary path for a Viterbi decoder;
   calculating a differential metric value representing a relative quality of the best path versus the secondary path;
   determining slicer errors for the best path and the secondary path for current symbols;
   subtracting the best path slicer error from the secondary path slicer error to obtain a result; and
   adding the result to the differential metric value to obtain a new differential metric value for use in selecting one of the best path and secondary path as a new best path.

9. The method of claim 8, wherein the step of storing further comprises the steps of:
   storing optimal data values for a best path of a plurality of states for a secondary path for the Viterbi decoder; and
   storing next optimal data values for a secondary path of the plurality of states for the Viterbi decoder.

10. The method of claim 9, wherein the step of calculating further comprises:
    initializing a differential metric value for each of the plurality of states, and
    wherein determining comprises computing a slicer error for both the best path and the secondary path for each of the plurality of states.

11. The method of claim 10, further comprising:
    computing the new differential metric value for each of the plurality of states; and
    determining the best path and the secondary path responsive to the new differential metric for each of the plurality of states.

12. The method of claim 11, wherein the step of determining the best path and the secondary path further comprises the step of correcting errors within the best traceback memory with the secondary traceback memory of the Viterbi decoder to obtain a lowest possible slicer error for subsequent data symbols.

13. The method of claim 12, wherein the step of correcting further comprises the steps of:
    determining if the new differential metric becomes negative;

if the new differential metric becomes negative, establishing the secondary path as the best path and the best path as the secondary path for the current state; and multiplying the new differential metric by −1.0.

14. The method of claim 13, wherein the step of determining the best path and the secondary path further comprises the steps of:

determining if the new differential metric is larger or smaller than the differential metric;

if the new differential metric is smaller, selecting a new secondary path; and if the new differential metric is larger, maintaining a current secondary path.

15. The method of claim 8, wherein the step of calculating comprises the steps of:

computing a best metric of the Viterbi decoder;

computing a secondary metric of the Viterbi decoder; and subtracting the secondary metric from the best metric to determine the differential metric value.

16. The method of claim 8, wherein the step of determining a slicer error further comprises the step of summing slicer errors for each channel associated with the best path and the secondary path.

17. A Decision Feedback Sequence Estimator (DFSE), comprising:

a best traceback memory storing data for a best path for a Viterbi decoder;

a secondary traceback memory storing data for a secondary path for the Viterbi decoder;

at least one decision feedback equalizer (DFE) filter for processing the data for the best path and generating a first output and for processing the data for the secondary path and generating a second output;

an adder for adding the first output and a feed forward equalizer (FFE) output signal and for adding the second output signal and the FFE output signal to generate first and second adder outputs, respectively;

a data slicer for computing a best path slicer error for the best path and a secondary path slicer path error for the secondary path responsive to the first and second adder outputs; and a path manager responsive to the best path slicer error and the secondary path slicer error for determining a differential metric and determining data stored in the best traceback memory and the secondary traceback memory.

18. The DFSE of claim 17, wherein determining the data stored in the path manager further comprises correcting the best traceback memory with the secondary traceback memory of the Viterbi decoder to obtain a lowest possible slicer error for subsequent data symbols.

19. The DFSE of claim 17, wherein correcting in the path manager further comprises:

determining if the new differential metric becomes negative;

if the new differential metric becomes negative, establishing the secondary path as the best path and the best path as the secondary path for the current state; and multiplying the new differential metric by −1.0.

20. The DFSE of claim 19, wherein determining in the path manager further comprises:

determining if the new differential metric is larger or smaller than the differential metric;

if the new differential metric is smaller, selecting a new secondary path;

if the new differential metric is larger, maintaining a current secondary path.

21. The DFSE of claim 17, wherein the best traceback memory has a same length as the DFE filter.

22. The DFSE of claim 17, wherein the secondary traceback memory has a length smaller than a length of the DFE filter.

23. The DFSE of claim 17, wherein the DFE filter generates the second output responsive to both the data in the best traceback memory and the data in the second traceback memory.

24. The DFSE of claim 17, wherein the path manager is further responsive to a current best metric and a current secondary metric.

25. A method, comprising the steps of:

storing optimal data values for a best path of a plurality of states for a secondary path for a Viterbi decoder;

storing next optimal data values for a secondary path of the plurality of states for the Viterbi decoder;

initializing a differential metric value for each of the plurality of states, the differential metric value representing a relative quality of the best path versus the secondary path; and determining a slicer error for current symbols for both the best path and the secondary path for each of the plurality of states; and correcting errors for previous symbols responsive to the determined slicer errors.

* * * * *